(12) United States Patent
Wangn et al.

(10) Patent No.: US 6,559,512 B2
(45) Date of Patent: May 6, 2003

(54) ADJUSTABLE IN-LINE LEADS FOR LIGHT EMITTING DEVICE PACKAGE

(75) Inventors: Bily Wangn, Hsin-Chu (TW); Bill Chang, Hsin-Chu (TW); Chin-Mau James Hwang, Hsinchu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 09/920,279

(22) Filed: Aug. 2, 2001

(65) Prior Publication Data
US 2003/0025169 A1 Feb. 6, 2003

(51) Int. Cl.[7] ............................................. H01L 31/0203
(52) U.S. Cl. ........................................ 257/433; 438/64
(58) Field of Search ................... 257/431, 432, 257/428, 433, 434, 435, 436, 447, 448, 459, 460

(56) References Cited

U.S. PATENT DOCUMENTS

| 5,642,373 A | * | 6/1997 | Kamizato et al. ............. 372/50 |
| 6,025,213 A | * | 2/2000 | Nemoto et al. ............. 438/122 |
| 6,313,525 B1 | * | 11/2001 | Sasano ........................ 257/704 |

FOREIGN PATENT DOCUMENTS

| JP | 362005674 A | * | 1/1987 | .................. 257/95 |

* cited by examiner

Primary Examiner—Olik Chaudhuri
Assistant Examiner—Dana Farahani
(74) Attorney, Agent, or Firm—H. C. Lin

(57) ABSTRACT

The leads of a light emitting device package are extended is flexible pins. These pins can be bent with respect to a motherboard so that the direction of the light entitled from the light emitting device can be adjusted. The package is tab-mounted to the motherboard for heat sinking or serving as a lead.

19 Claims, 22 Drawing Sheets

ADJUSTABLE IN-LINE LEADS FOR LIGHT EMITTING DEVICE PACKAGE

BACKGROUND OF THE INVENTION (1) Field of Invention

This invention relates to light emitting devices, particularly to the package of such devices.

(2) Brief Description of Related Art

FIG. 1 shows a prior art package for a light emitting device. The light emitting device 10 is mounted over a metal plate 11 with an extension to serve as the lead of the bottom electrode of the device 10. The top electrode of the device 10 is wire-bonded by wire 13 to a second metal plate 12 with an extension to serve as the lead for the top electrode of the device. The structure is sealed in transparent glue as shown in the side-view FIG. 2 for protection and improvement in reliability. The bottoms of the metal plates 11, 12 can be soldered to a motherboard for surface-mounting.

The drawback of the kind of package is that the package is fixed to the motherboard so the light can only be emitted in a direction perpendicular to the motherboard. Also, the package does not have heat-sinking provision.

SUMMARY OF THE INVENTION

An object of this invention is to provide a light emitting package capable of adjusting the direction of light emission. Another object of this invention is to provide a light emitting package capable of heat sinking.

These objects are achieved by extending the leads of the package into pin-shaped forks or thin-plate shaped forks. The number of leads can be two or more than two. The leads can be bent to emit light a desired direction. One of the leads is coupled to a tab for heat sinking.

DETAILED DESCRIPTION OF THE INVENTION

Figure 1:
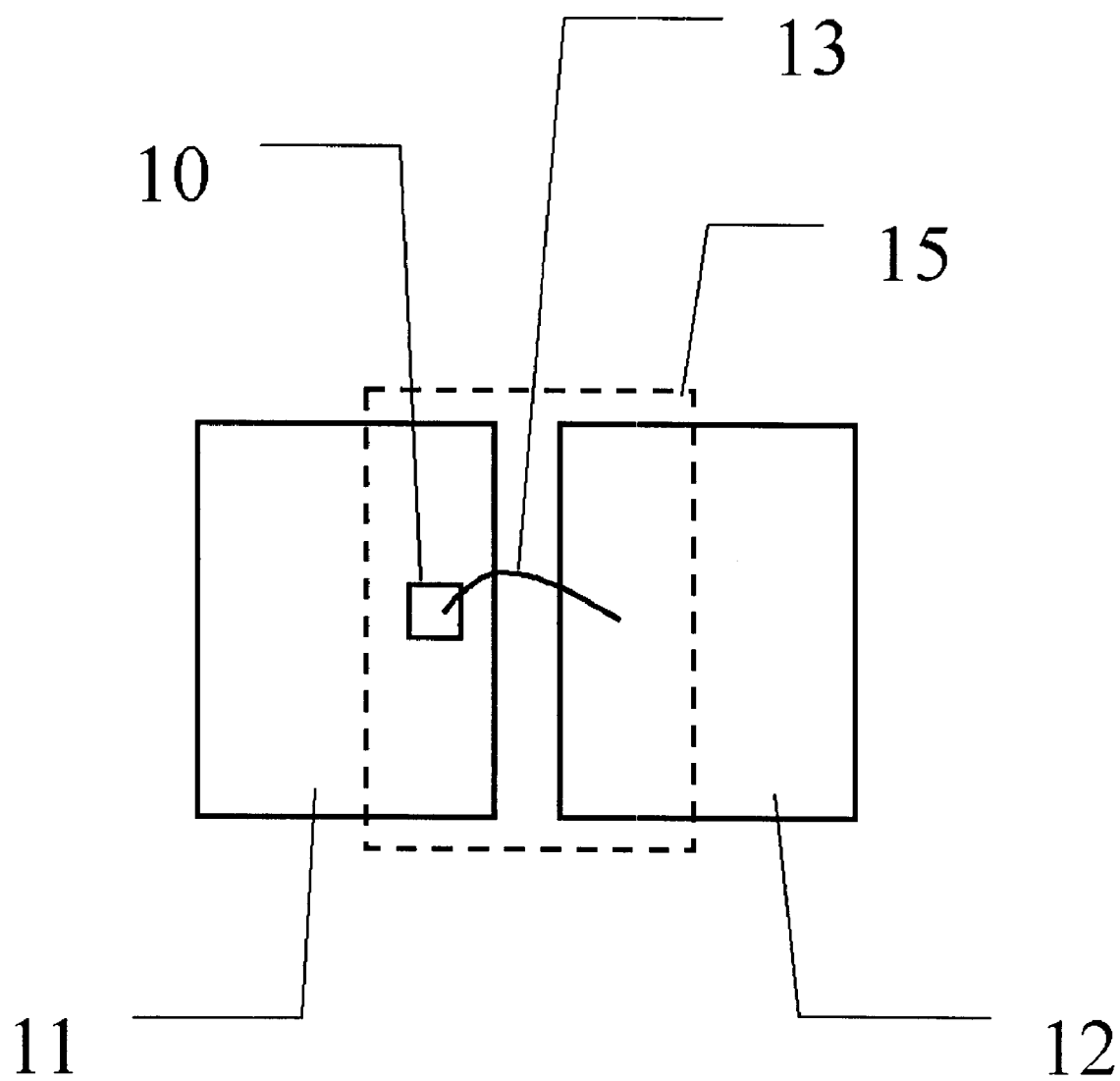
FIG. 1 shows the top view a prior art surface-mount package for a light emitting device.
Figure 2:
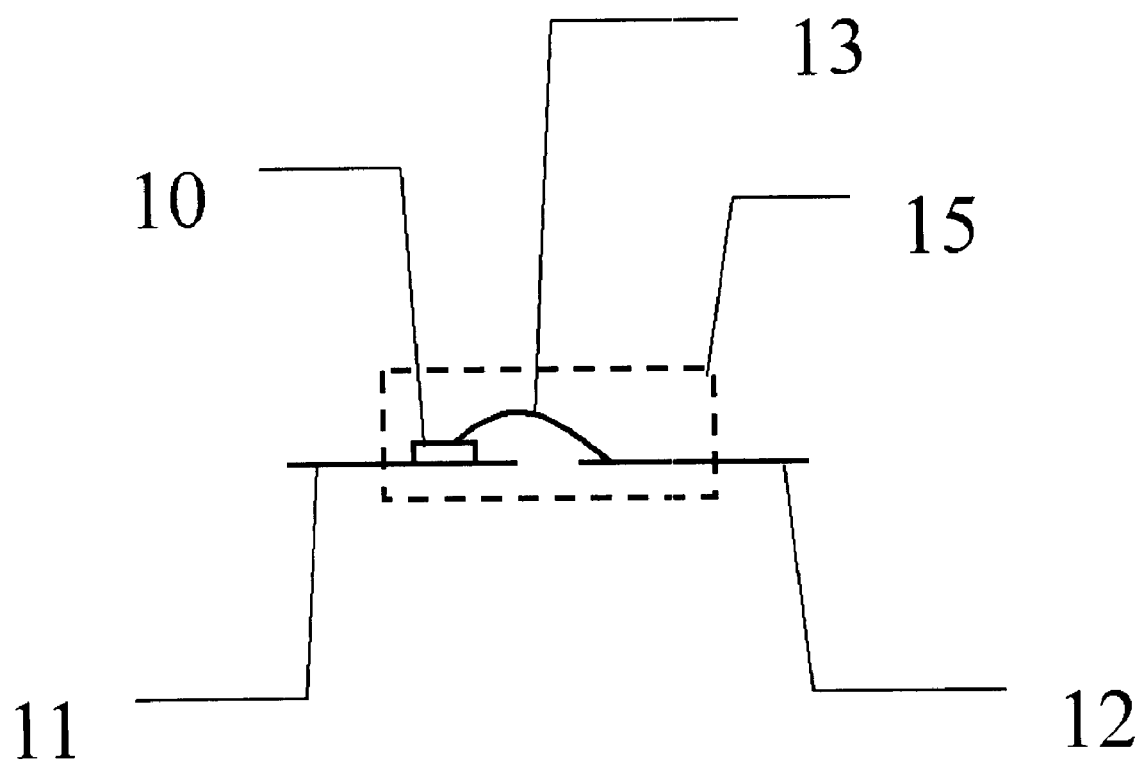
FIG. 2 shows the side view of FIG. 1.
Figure 3:
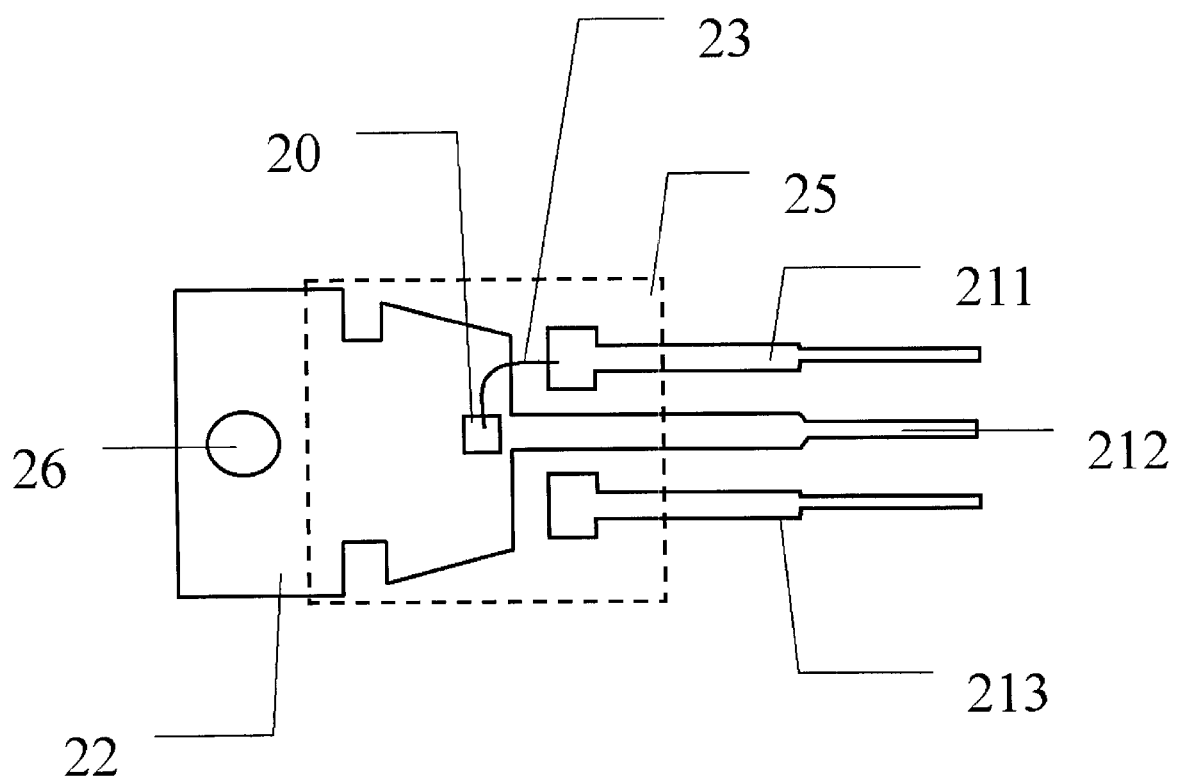
FIG. 3 shows the top-view of the basic fork-shaped leads of the present invention.

FIG. 3 shows the basic structure of the present invention. A light emitting device chip 20 is mounted on metal substrate 22. The electrodes of the chip are connected to pin-shaped leads 211, 212, 213 extending toward one side of the metal plate 22. The middle lead 212 is continuous with the metal 22, which is in contact with the bottom electrode of the chip 20. The top electrode is wire-bonded-by wire 23 to the lead 211. The lead 213 is unused. The chip, the bonding pads of the leads and the major portion of the metal plate 22 are sealed with transparent glue 25 to protect the combined structure and to stiffen leads 211, 212 and 213 in position. The leads can be bent so the direction of the light emitted from the chip can be adjusted. The opposite side of the metal plate 22 is extended outside the seal 25 to form a tab with a mounting hole 26, which can be clamped by a screw to a motherboard to serve as a heat sink.

Figure 4:
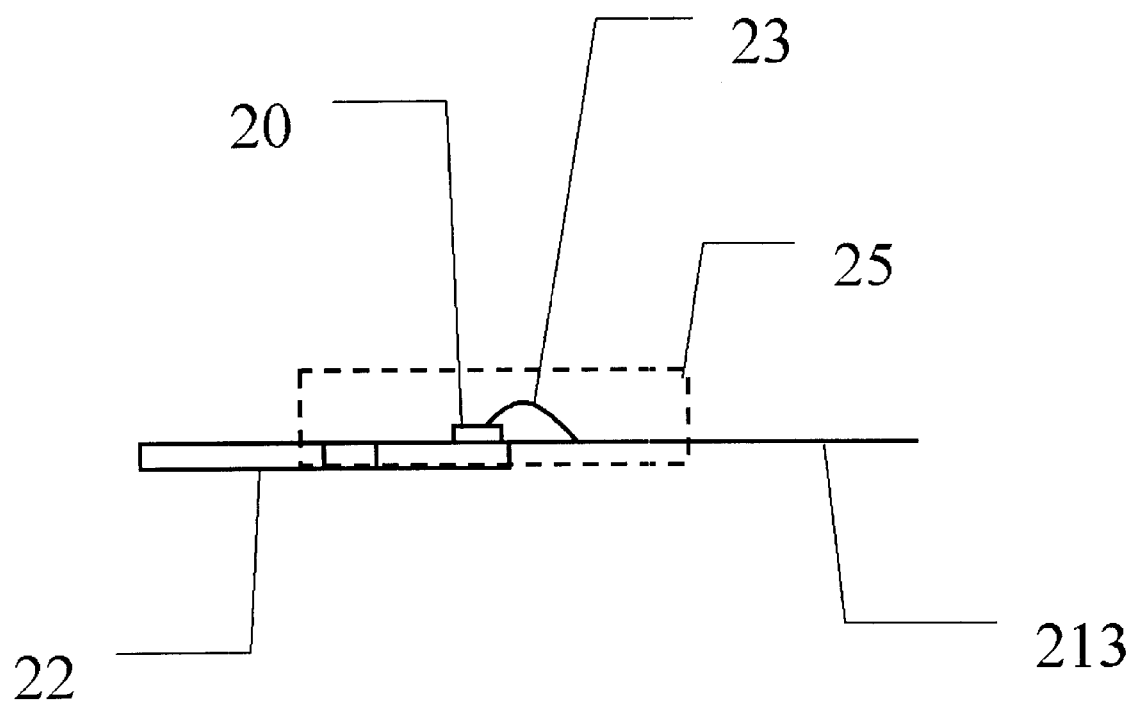
FIG. 4 shows the side-view of FIG. 3.

FIG. 4 shows the side view of FIG. 3, showing the chip 20 is wire-bonded to the lead 213 and sealed inside the glue 25.

Figure 5:
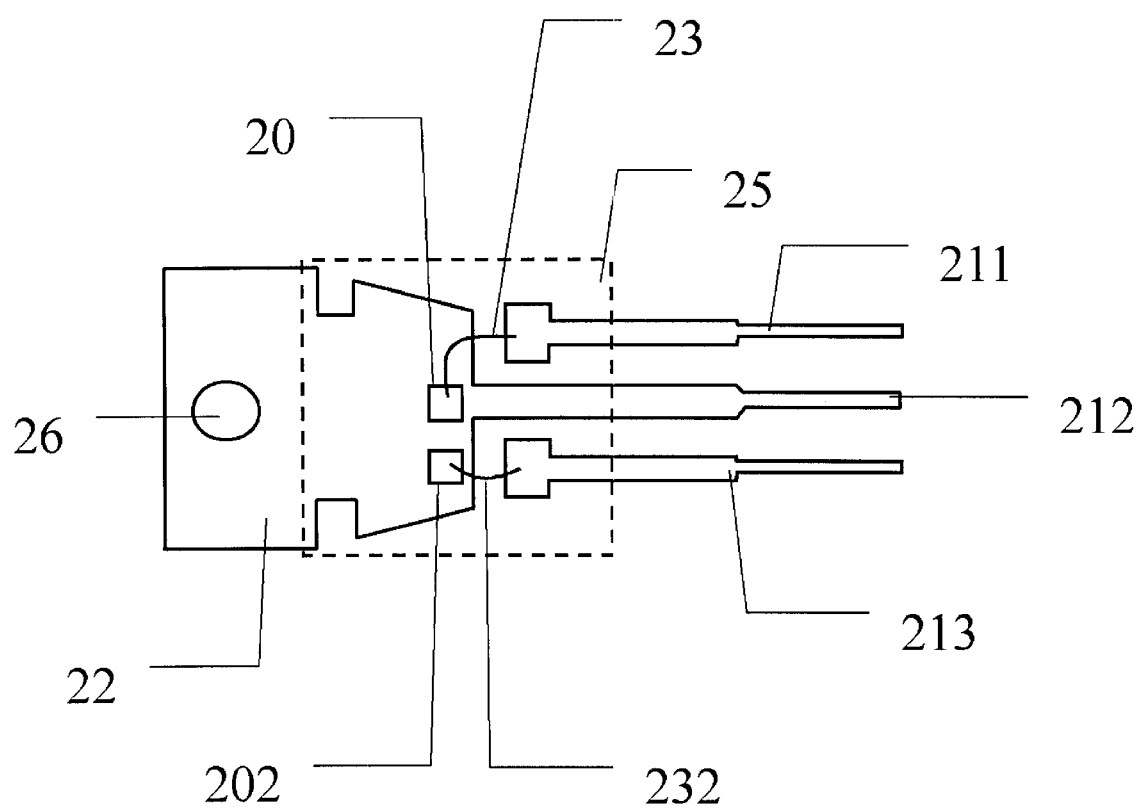
FIG. 5 shows a top view of the package with two chips.

FIG. 5 shows two chips 20 and 202 mounted on the metal plate 22. The bottom electrodes of the chips 20 and 202 are both in contact with the common lead 212. The top electrode of the chip 20 is wire-bonded by wire 23 to lead 211. The top electrode of the chip 202 is wire-bonded by wire 232 to the lead 213.

Figure 6:
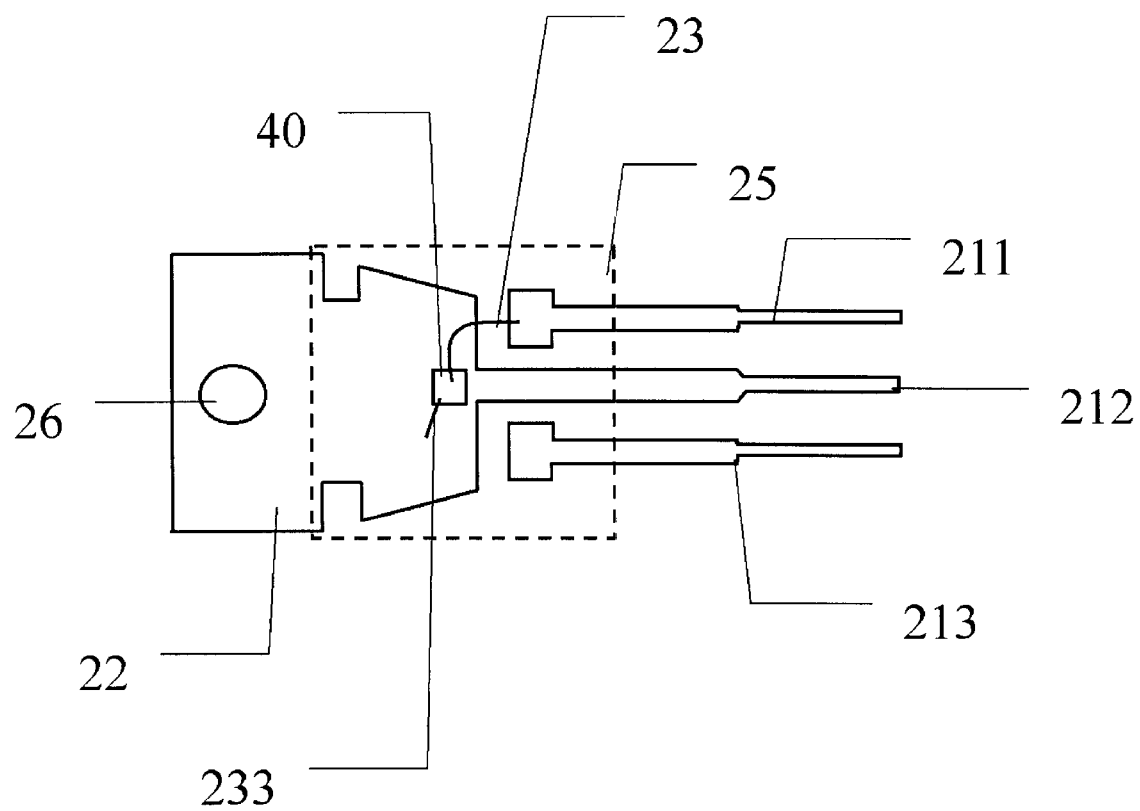
FIG. 6 shows the top view of the package for a chip with two top electrodes.

FIG. 6 shows a chip 40 with two top electrodes. One top electrode is wire-bonded by wire 23 to lead 211. The second top electrode is wire-bonded by wire 233 to the lead 212.

Figure 7:
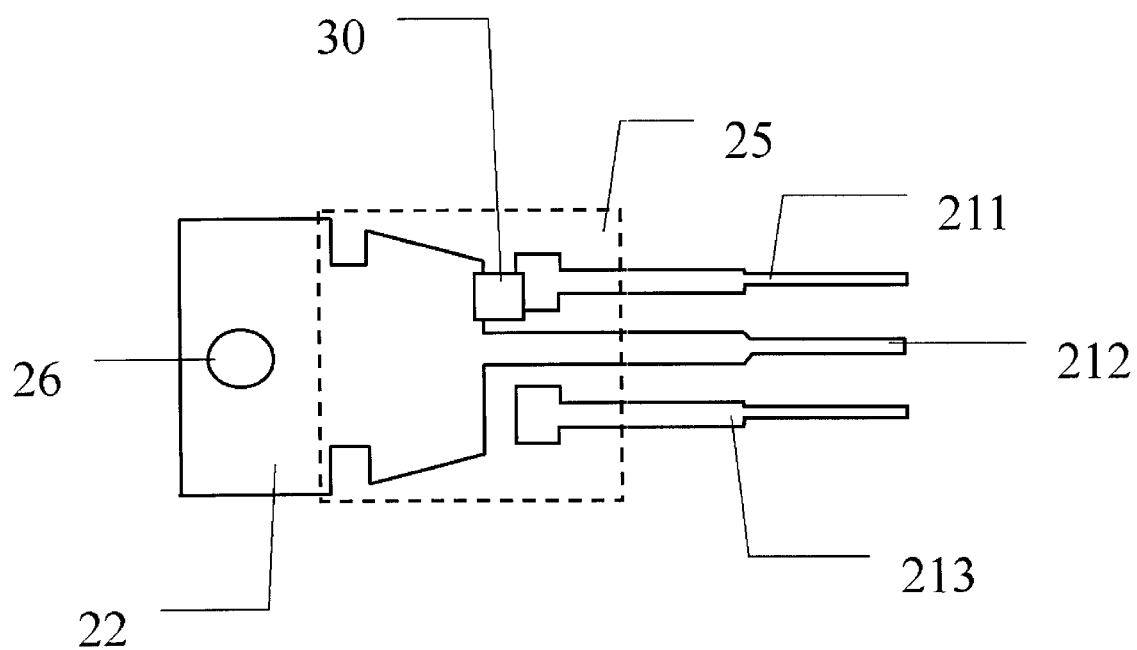
FIG. 7 shows the top view of the package for a chip with two bottom electrodes.

FIG. 7 shows a chip 30 with two bottom electrodes straddling over the two leads 211 and 212.

Figure 8:
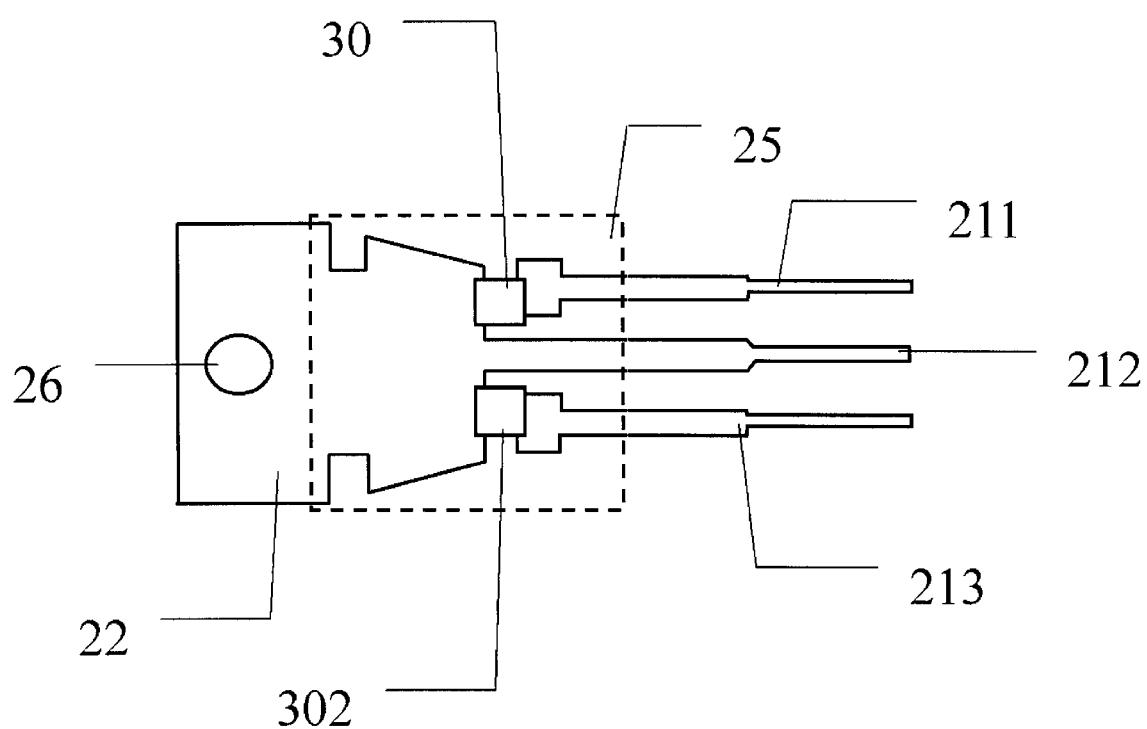
FIG. 8 shows the top view of the package for two chips each with two bottom electrodes.

FIG. 8 shows two chips 30 and 302 each having two bottom electrodes. The chip 30 straddles over the leads 211 and 212. The chip 301 straddles over the leads 212 and 213.

Figure 9:
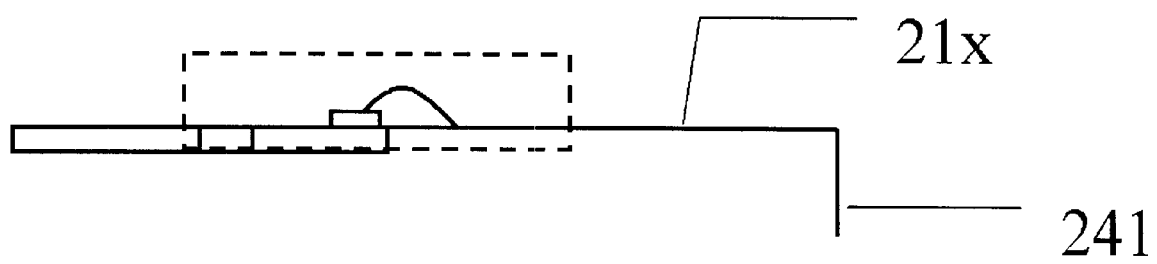
FIG. 9 shows the package with the lead bent at right angle.

FIG. 9 shows how the end 241 of a lead 21x as in FIG. 3 is bent in right angle to change the direction of light emission from the light emitting chip perpendicular to the motherboard, to which the leads are inserted.

Figure 10:
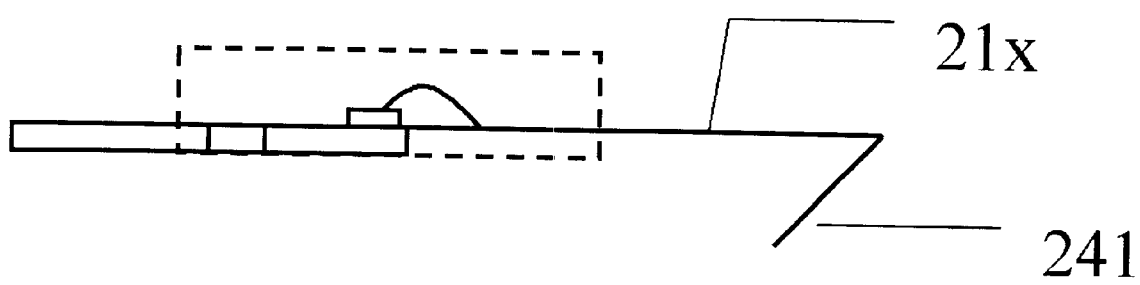
FIG. 10 shows the package with the lead bent at acute angle.

FIG. 10 shows the how the end 241 of lead 21x is bent by an acute angle to change the direction of light emission from the light emitting chip at an acute angle with respect to the motherboard to which the leads are inserted.

Figure 11:
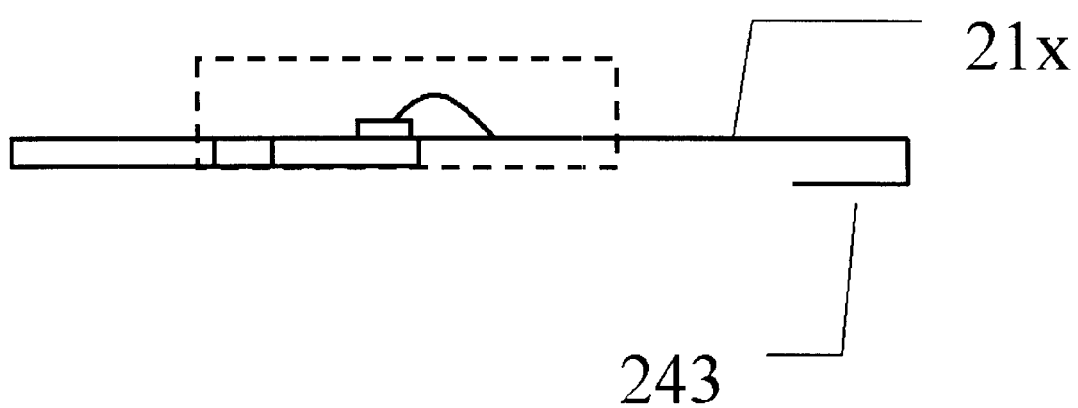
FIG. 11 shows the package with the lead folded.

FIG. 11 shows the ends of the leads 21x are folded at the end 243.

Figure 12:
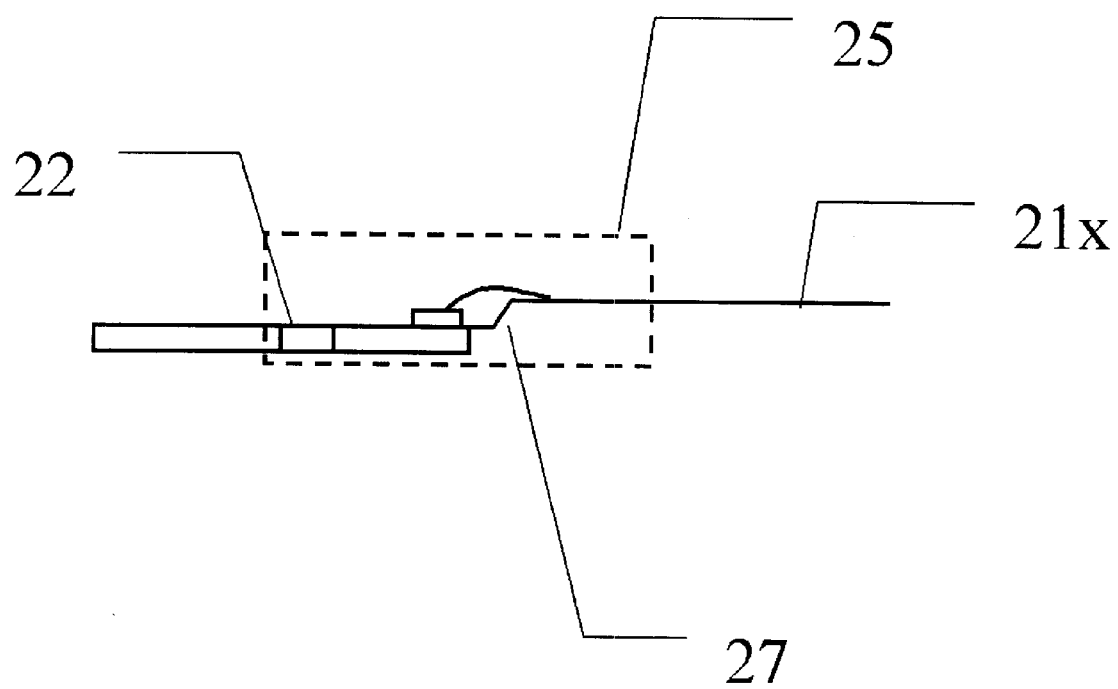
FIG. 12 shows the package with the zigzag lead.

FIG. 12 shows a zigzag lead 21x. The bend 27 increase the imbedded area of the lead 21x in the, glue 25, thereby strengthening the lead 21x.

Figure 13:
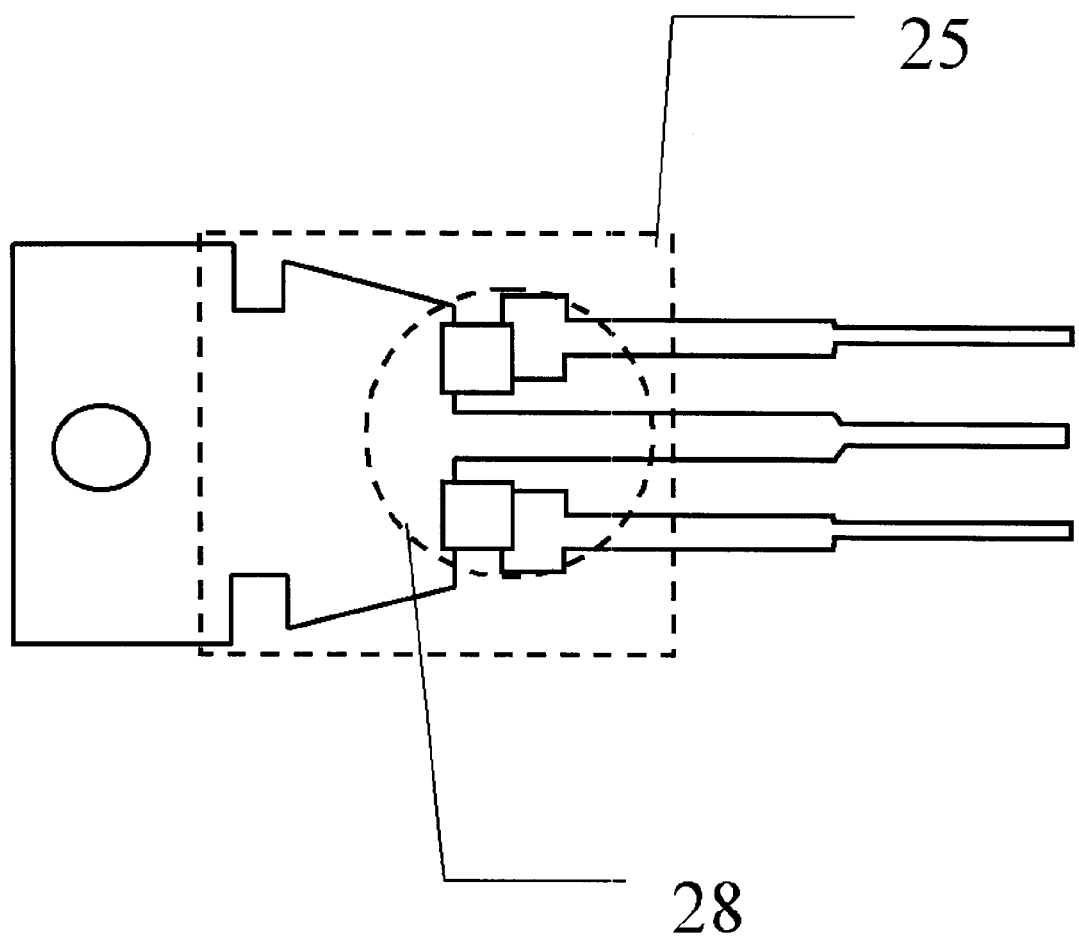
FIG. 13 shows the package with a focusing wall.
Figure 14:
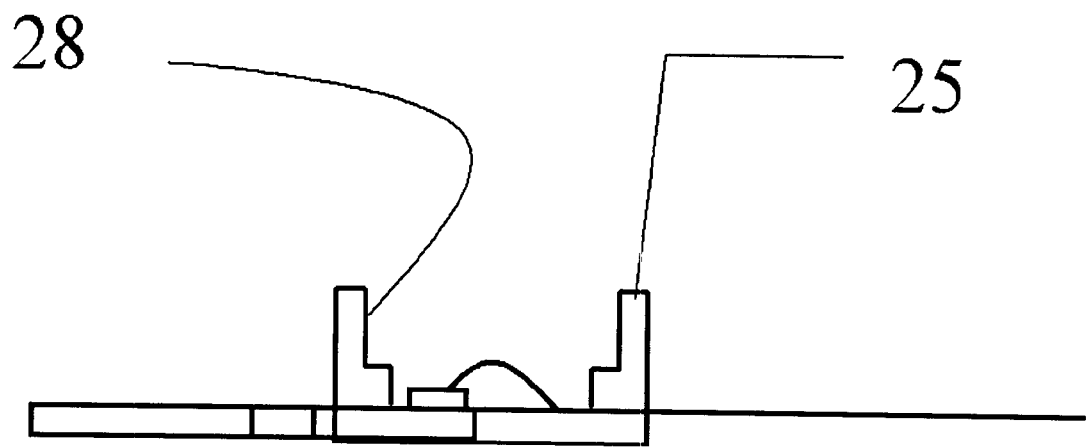
FIG. 14 shows the package with a stepped focusing wall.
Figure 15:
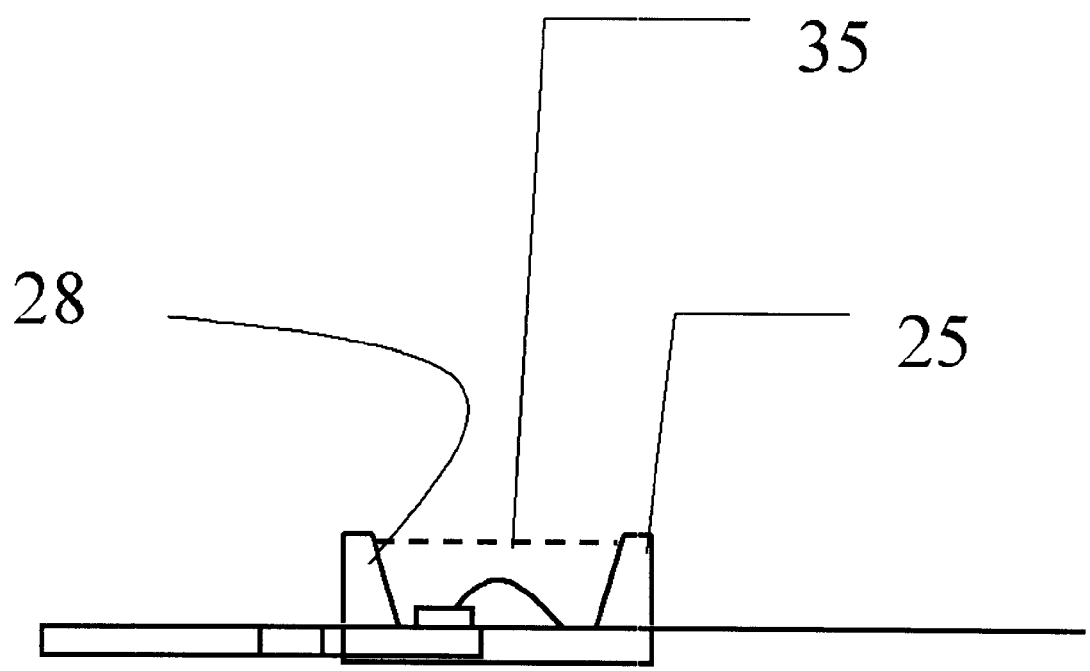
FIG. 15 sows the package with a bevel focusing wall.

FIG. 13 shows the glue 25 forming a cup 28 over and surrounding the light emitting chips. The cup window exposes the light emitting device without being imbedded in the glue, thereby allowing more light transmission. The wall 28 of the cup can have a step as shown in FIG. 14, which is the side-view of FIG. 13. The wall 28 of the cup may be beveled to form a focusing cup as shown in FIG. 15.

Figure 16:
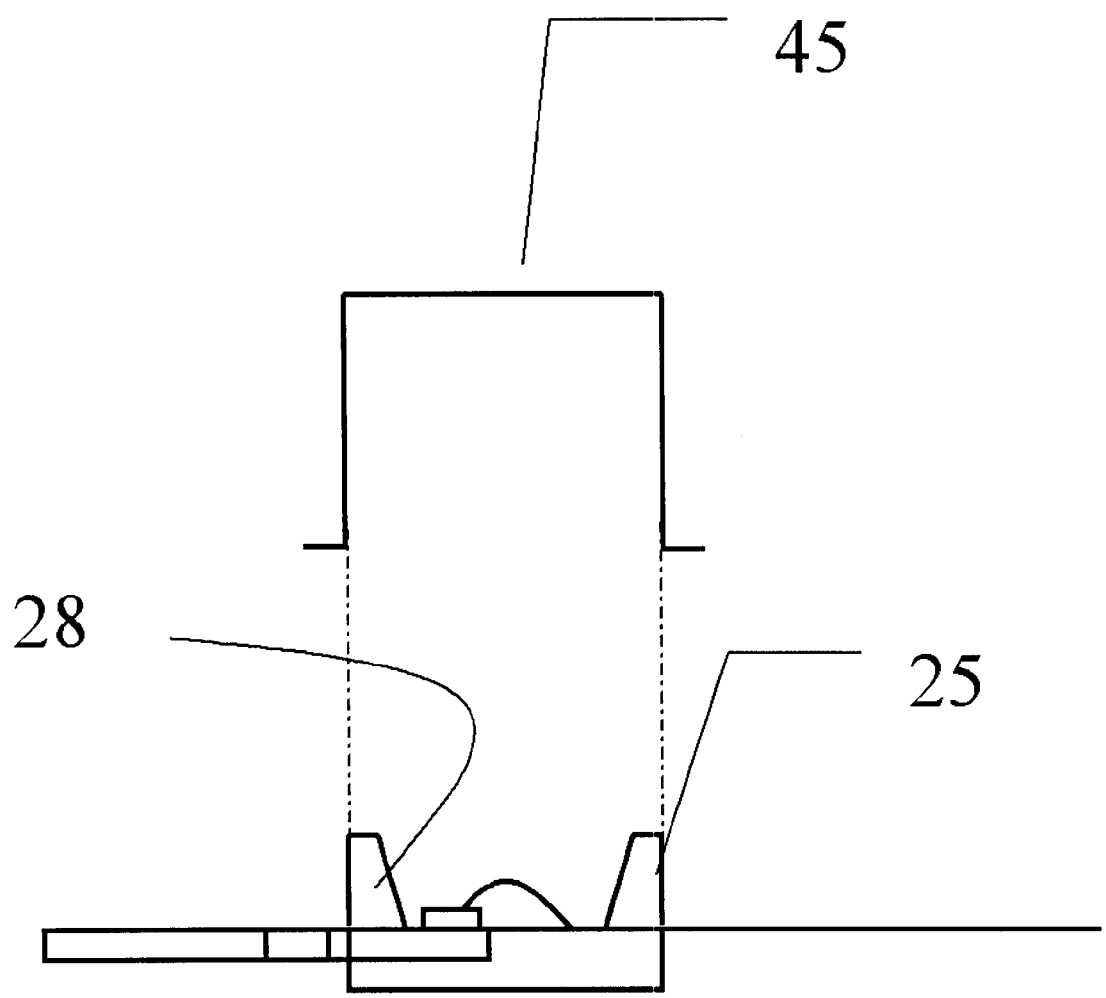
FIG. 16 shows the package with a transparent cover.

FIG. 16 shows a transparent cover 45 mounted over the wall 28 of the cup 25 to protect the light emitting device.

Figure 17:
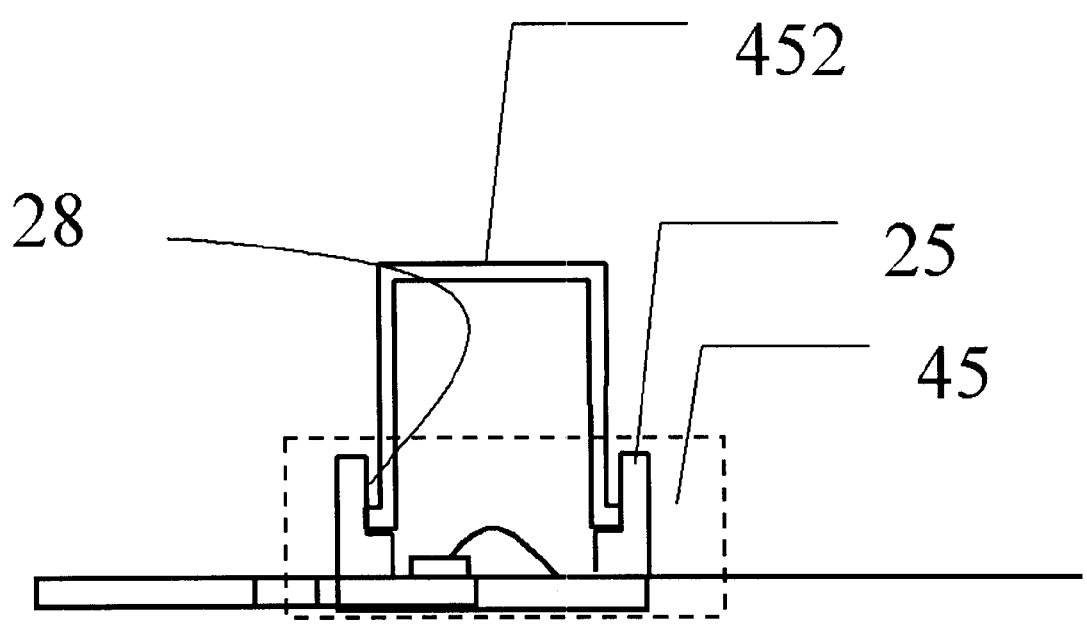
FIG. 17 shows the package with a transparent cover anchored in the stepped wall.

FIG. 17 shows a transparent cover 452 resting on the step of the wall shown in FIG. 14, and the glue 45 seals the structure outside the cover 452.

Figure 18:
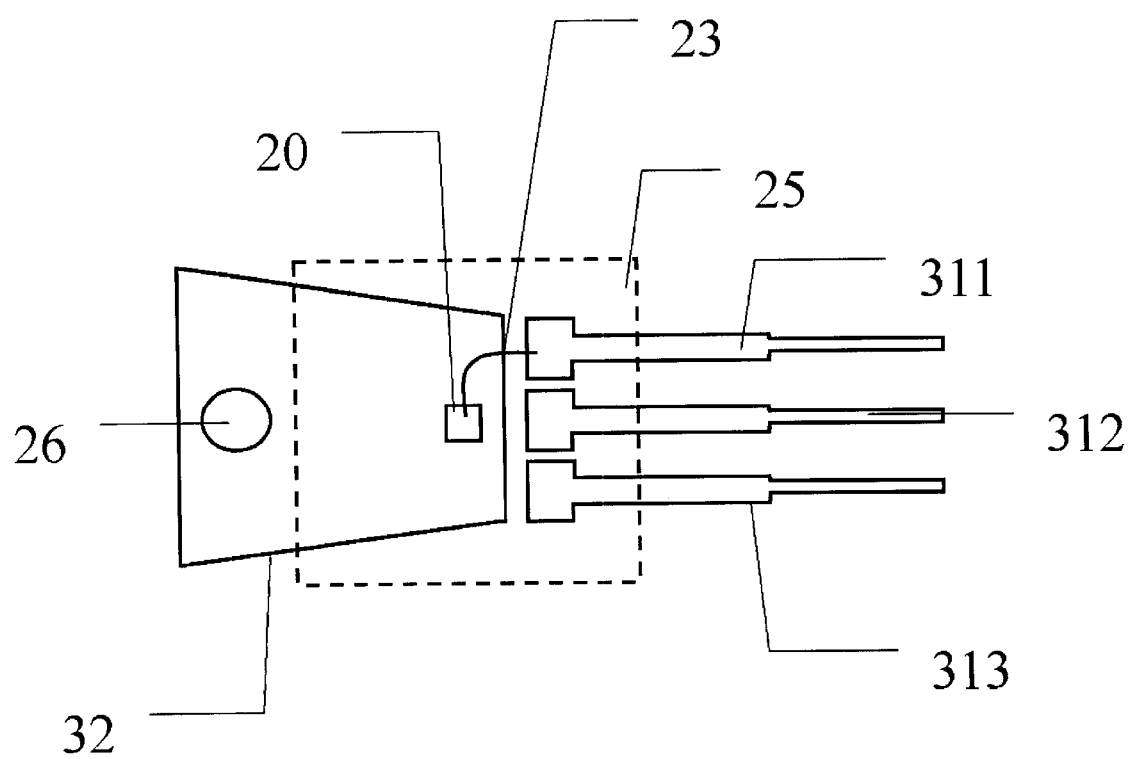
FIG. 18 shows the package with light emitting device mounted on a heat sinking tab.

FIG. 18 shows a structure in which the metal tab 32 is separated from the lead 312. The chip is mount on the metal tab 32 serving as one lead for the bottom electrode of chip 20, and the top electrode of the chip 20 is wire-bonded by wire 23 to the lead 311. The tab 32 also serves as a heat sink by clamping the tab to a motherboard with a screw through the hole 26.

Figure 19:
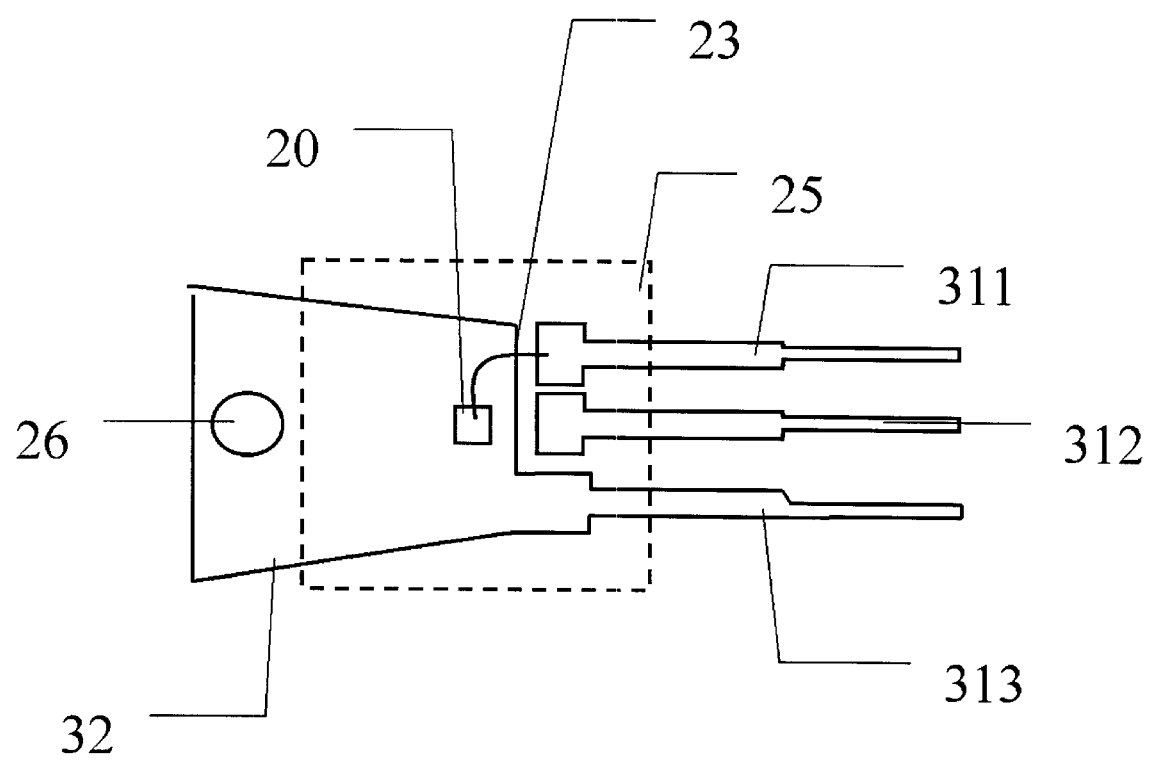
FIG. 19 shows the package with one lead connected to the heat sinking tab.

FIG. 19 shows the metal tab 32 is continuous with a side lead 313 instead of a middle lead 312 shown in FIG. 3.

Figure 20:
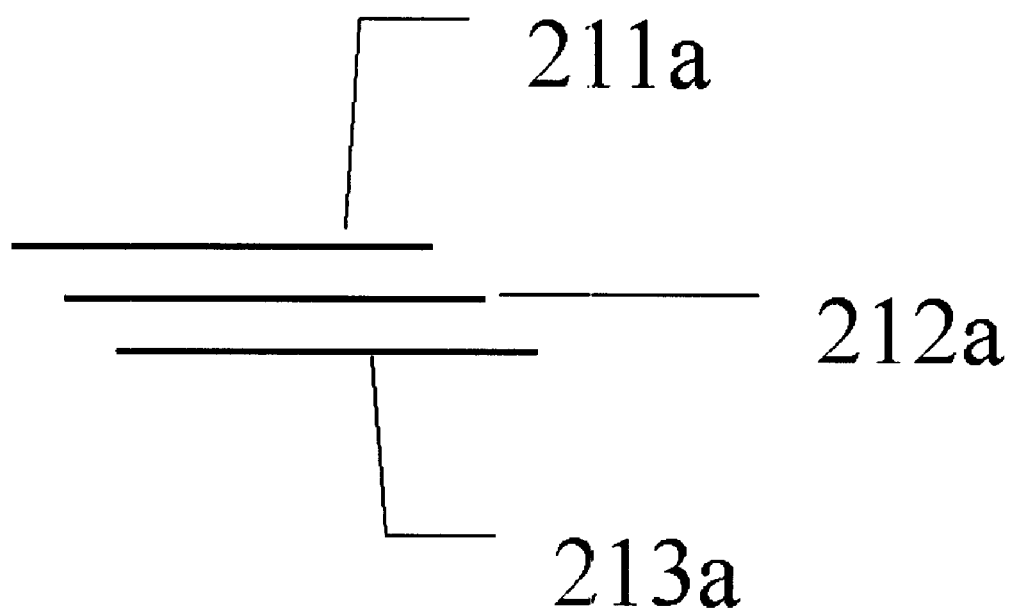
FIG. 20 shows the leads lying on the same plane.

FIG. 20 shows all three leads 211a, 212a and 213a are in parallel.

Figure 21:
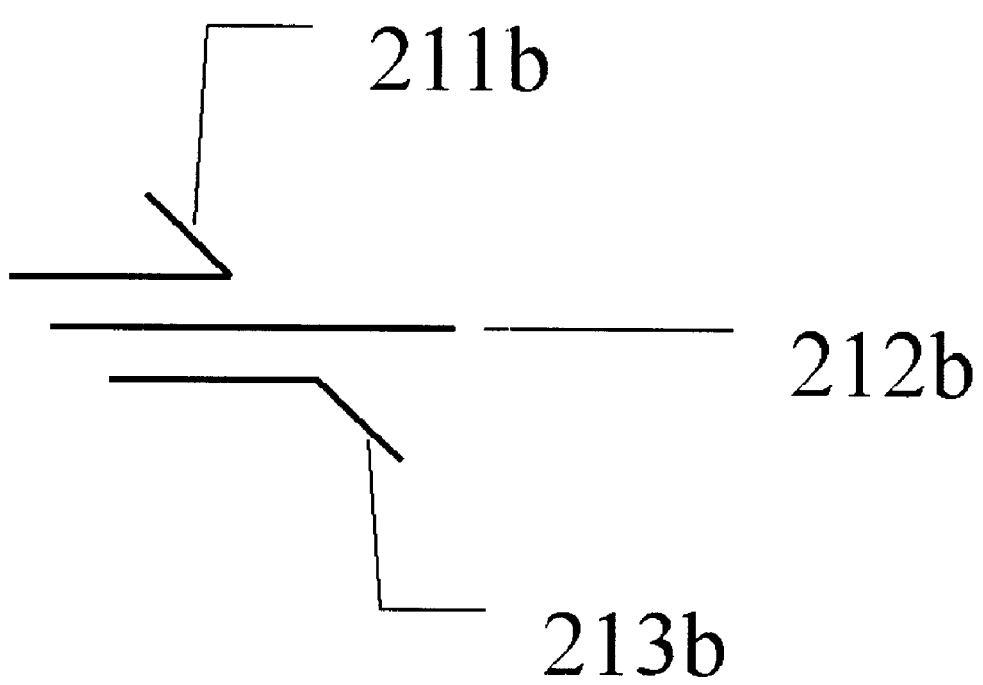
FIG. 21 shows the leads bent in different directions.

FIG. 21 shows the three leads bent in different directions with leads 211b and 213b bent away from the middle lead 212b.

Figure 22:
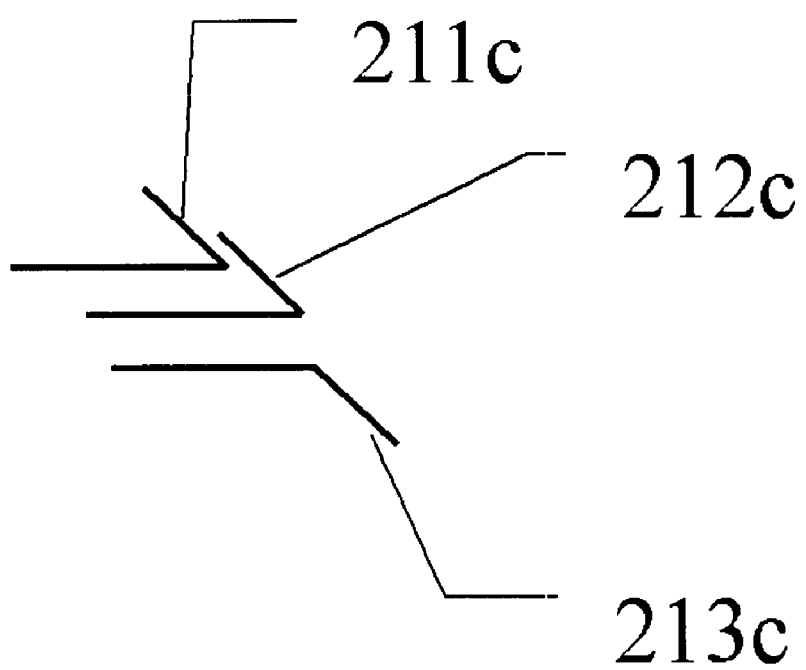
FIG. 22 shows the two leads bent in the same direction and a third lead in opposite direction.

FIG. 22 shows two the leads 211C and 212C bent in one direction and the lead 213C bent in an opposite direction.

While the foregoing embodiments show only three leads, the number of leads is not limited to three leads. Two leads or more than three leads can be fabricated in a similar fashion.

While the preferred embodiments of the invention have been described, it will be apparent to those skilled in the art that various modifications may be made in the embodiments without departing from the spirit of the present invention. Such modifications are all within the scope of this invention.

What is claimed is:

1. A light emitting device package, comprising:
   at least one light emitting chip;
   a metallic plate on which said chip is mounted, extending to a first side of said chip as a tab for heat sinking;
   at least two flexible pin-shaped leads for the electrodes of said chip extending to a side opposite to said first side and capable of being bent to change the direction of light emission from said chip;
   connection between at least one of the electrodes of said chip and at least one of said leads; and
   a glue to bind and seal together said light emitting chip and inner sections of said leads and said tab toward each other as a unitary package, and to expose outer sections of said leads and said tab away from each other for external connection.

2. The light emitting device package as described in claim 1, wherein said metallic tab is continuous with one of said leads.

3. The light emitting device package as described in claim 1, wherein one light emitting chip has a bottom electrode contacting a first lead of said leads, and a top electrode wire-bonded to a second lead of said leads.

4. The light emitting device package as described in claim 1, wherein there two said chips, each with a bottom electrode mounted on said metal tab and the top electrodes individually wire-bonded to two separate leads not continuous with said tab.

5. The light emitting device package as described in claim 1, wherein there is one chip with two top electrodes, each wire-bonded to two separate said leads.

6. The light emitting device package as described in claim 1, wherein there is only one chip with two bottom electrodes straddling over two separate said leads.

7. The light emitting device package as described in claim 1, wherein there are two said chips, each with two bottom electrodes straddling over a common lead of said lead and a separate lead.

8. The light emitting device package as described in claim 1, wherein the ends of said leads are bent to adjust the direction of light emission.

9. The light emitting device package as described in claim 8, wherein said ends are bent at right angle.

10. The light emitting device package as described in claim 8, wherein said ends are bent at an acute angle.

11. The light emitting device package as described in claim 8, wherein the ends are folded.

12. The light emitting device package as described in claim 1, wherein the leads are of zigzag shape to increase the area imbedded in said glue.

13. The light emitting device package as described in claim 1, further comprising a cup cut into said glue to expose the light emitting chip.

14. The light emitting device package as described in claim 13, wherein the wall of said cup is beveled.

15. The light emitting device package as described in claim 13, further comprising a transparent cover for said cup.

16. The light emitting device as described in claim 13, wherein the wall of said cup has a step.

17. The light emitting device as described in claim 16, wherein a transparent cover fits over said step.

18. The light emitting device package as described in claim 1, wherein the tab serves as one lead for said chip and for heat sinking when the tab is clamped to a motherboard.

19. The light emitting device package as described in claim 1, wherein said leads are bent in different directions.

* * * * *

UNITED STATES PATENT AND TRADEMARK OFFICE
CERTIFICATE OF CORRECTION

PATENT NO. : 6,559,512 B2  
DATED : May 6, 2003  
INVENTOR(S) : Bily Wang, Bill Chang and Chin-Mau James Hwang It is certified that error appears in the above-identified patent and that said Letters Patent is hereby corrected as shown below:

<u>Title page,</u>
Item [75], Inventors, should read -- Bily Wang; Bill Chang; and Chin-Mau James Hwang --

Signed and Sealed this

Twenty-sixth Day of August, 2003

JAMES E. ROGAN
*Director of the United States Patent and Trademark Office*